US012765019B2

(12) United States Patent
Watabe et al.

(10) Patent No.: US 12,765,019 B2
(45) Date of Patent: Oct. 13, 2026

(54) LAMINATED STRUCTURE, SEMICONDUCTOR DEVICE AND METHOD FOR MANUFACTURING LAMINATED STRUCTURE

(71) Applicant: SHIN-ETSU CHEMICAL CO., LTD., Tokyo (JP)

(72) Inventors: Takenori Watabe, Annaka (JP); Hiroshi Hashigami, Annaka (JP); Takahiro Sakatsume, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 425 days.

(21) Appl. No.: 18/287,939

(22) PCT Filed: Mar. 30, 2022

(86) PCT No.: PCT/JP2022/015911
§ 371 (c)(1),
(2) Date: Oct. 23, 2023

(87) PCT Pub. No.: WO2022/230577
PCT Pub. Date: Nov. 3, 2022

(65) Prior Publication Data
US 2024/0250115 A1 Jul. 25, 2024

(30) Foreign Application Priority Data
Apr. 28, 2021 (JP) ................................ 2021-076657

(51) Int. Cl.
*H10P 14/20* (2026.01)
*C30B 25/16* (2006.01)
(Continued)

(52) U.S. Cl.
CPC ............ *H10D 62/40* (2025.01); *C30B 25/16* (2013.01); *C30B 25/18* (2013.01); *C30B 29/16* (2013.01);
(Continued)

(58) Field of Classification Search
CPC ..... H10D 62/40; C30B 25/18; H10P 14/2921; H10P 14/2925; H10P 14/3234;
(Continued)

(56) References Cited

U.S. PATENT DOCUMENTS

2008/0166951 A1 7/2008 Tanikella et al.
2011/0233562 A1 9/2011 Harada et al.
(Continued)

FOREIGN PATENT DOCUMENTS

CN 103382575 A 11/2013
EP 3 437 798 A1 2/2019
(Continued)

OTHER PUBLICATIONS

Feb. 3, 2026 Office Action issued in Taiwanese Patent Application No. 111110480.
(Continued)

*Primary Examiner* — David Vu
*Assistant Examiner* — Brandon C Fox
(74) *Attorney, Agent, or Firm* — Oliff PLC

(57) ABSTRACT

A laminated structure including, a ground substrate with a crystalline oxide film containing gallium oxide as a main component and a root-mean-square of a roughness on a surface of the crystalline oxide film is 0.2 μm or less. A diameter of the ground substrate is 50 mm or more and TTV of the ground substrate is 30 μm or less.

17 Claims, 2 Drawing Sheets

(51) Int. Cl.
*C30B 25/18* (2006.01)
*C30B 29/16* (2006.01)
*H10D 62/40* (2025.01)
*H10P 14/24* (2026.01)

(52) U.S. Cl.
CPC .......... *H10P 14/24* (2026.01); *H10P 14/2921* (2026.01); *H10P 14/2924* (2026.01); *H10P 14/2925* (2026.01); *H10P 14/2926* (2026.01); *H10P 14/3238* (2026.01); *H10P 14/3434* (2026.01); *H10P 14/3451* (2026.01)

(58) Field of Classification Search
CPC ............. H10P 14/3238; H10P 14/3451; H10P 14/2926; H10P 14/2924
See application file for complete search history.

(56) References Cited

U.S. PATENT DOCUMENTS

| | | | | |
|---|---|---|---|---|
| 2014/0103353 | A1 | 4/2014 | Ishibashi et al. | |
| 2015/0179445 | A1* | 6/2015 | Sasaki | H10P 14/3434 257/43 |
| 2015/0279944 | A1 | 10/2015 | Hitora et al. | |
| 2024/0170542 | A1* | 5/2024 | Kaneko | C30B 25/02 |
| 2024/0268022 | A1* | 8/2024 | Fujimura | H05K 1/053 |

FOREIGN PATENT DOCUMENTS

| | | | |
|---|---|---|---|
| JP | 2013-028480 | A | 2/2013 |
| JP | 2015-039033 | A | 2/2015 |
| JP | 2015-129057 | A | 7/2015 |
| JP | 2015-199649 | A | 11/2015 |
| JP | 2021-024184 | A | 2/2021 |
| TW | 201417148 | A | 5/2014 |

OTHER PUBLICATIONS

Sep. 10, 2024 Office Action issued in Japanese Patent Application No. 2023-517200.
Mar. 18, 2025 Extended European Search Report issued in European Patent Application No. 22795493.0.
Ha Minh-Tan et al: "Understanding Thickness Uniformity of Ga2O3 Thin Films Grown by Mist Chemical Vapor Deposition", ECS Jouranl of Solid State Science and Technology, vol. 8, No. 7, Jan. 2019 (Jan. 2019), pp. Q3206-Q3212.
Kim Kyoung-Ho et al: "Growth of 2-Inch [alpha]-Ga2O3 Epilayers via Rear-Flow-Controlled Mist Chemical Vapor Deposition", ECS Journal of Solid State Science and Technology, vol. 8, No. 7, Jan. 2019 (Jan. 2019),pp. Q3165-Q3170.
Akaiwa, K. et al., "Electrical Conductive Corundum-Structured a-Ga2O3 Thin Films on Sapphire with Tin-Doping Frown by Spray-Assisted Mist Chemical Vapor Deposition," Japanese Journal of Applied Physics, vol. 51, pp. 070203-1 to 070203-3, 2012.
May 24, 2022 International Search Report issued in International Patent Application No. PCT/JP2022/015911.
Oct. 24, 2023 International Preliminary Report on Patentability issued in International Patent Application No. PCT/JP2022/015911.
Jul. 18, 2026 Office Action issued in Chinese Patent Application No. 202280030633.X.
May 7, 2026 Office Action issued in Japanese Patent Application No. 2025-062160.

* cited by examiner

[FIG. 1]
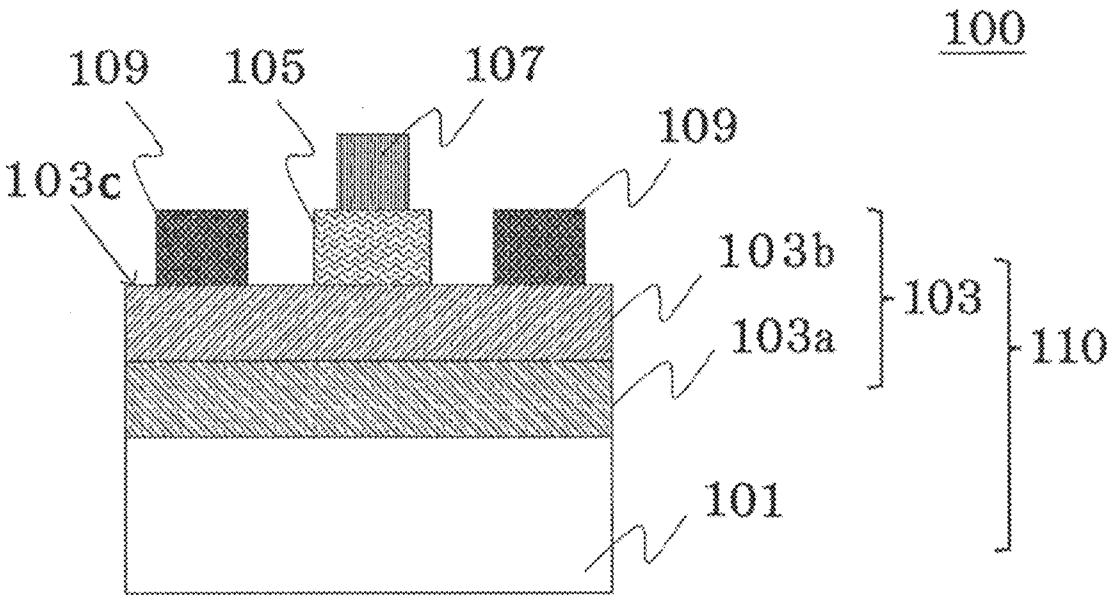
[FIG. 2]
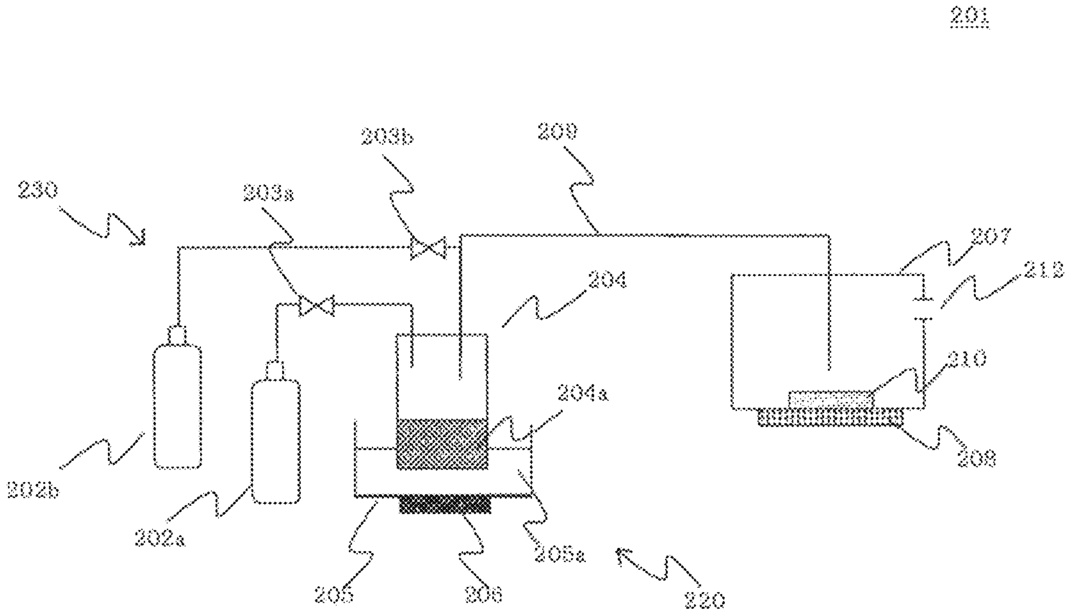

[FIG. 3]
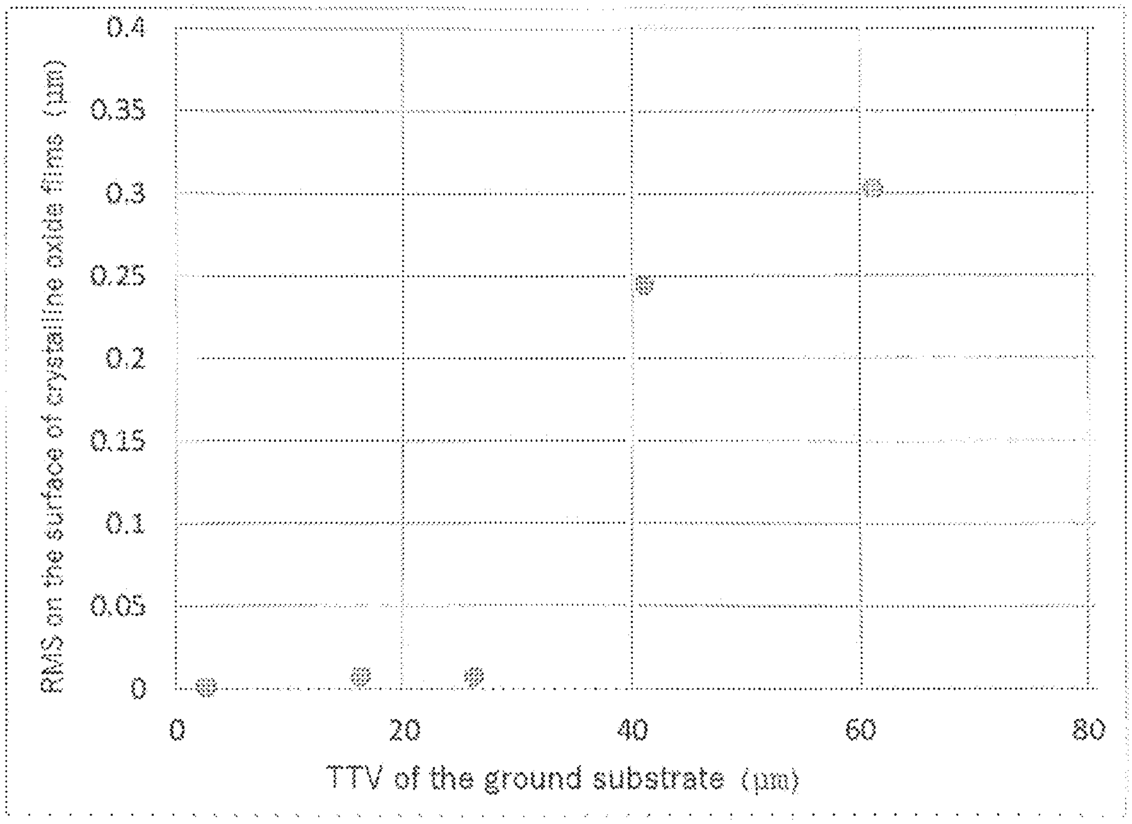
[FIG. 4]
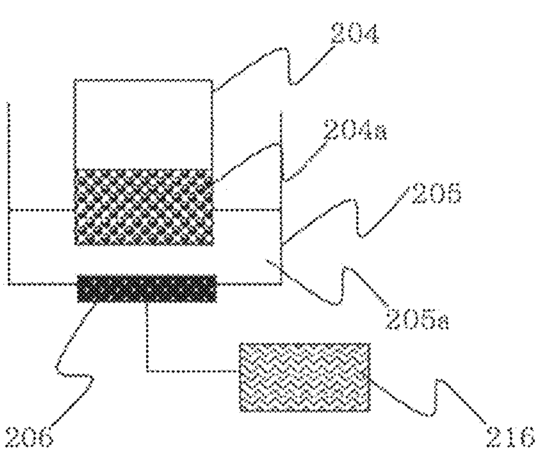

LAMINATED STRUCTURE, SEMICONDUCTOR DEVICE AND METHOD FOR MANUFACTURING LAMINATED STRUCTURE

TECHNICAL FIELD

The present invention relates to a laminated structure, a semiconductor device, and a method for manufacturing a laminated structure.

BACKGROUND ART

As a method for forming a gallium oxide-based thin film having high crystallinity on a specimen to be filmed, a mist CVD and other film-forming methods using water particles are known (Patent Document 1). In these methods, a gallium compound such as gallium acetylacetonate is dissolved in an acid such as hydrochloric acid to make a raw material solution. The raw material solution is microparticulated to produce raw material particles, and the raw material particle is supplied to a film-formation surface of the specimen to be filmed by a carrier gas. Then the gallium oxide-based thin film having high crystallinity is formed on the specimen to be filmed by a formation of a thin film on the film-formation surface through the reaction of raw material particles.

In order to manufacture semiconductor devices using the gallium oxide-based thin film, it is indispensable to control a conductivity of the gallium oxide-based thin films. Patent Document 1 and Non Patent Document 1 disclose techniques for doping impurities into an α-gallium oxide thin film.

CITATION LIST

Patent Literature

Patent Document 1: JP 2013-028480 A
Patent Document 2: JP 2015-199649 A

Non Patent Literature

Non Patent Document 1: Electrical Conductive Corundum-Structured $\alpha$-$Ga_2O_3$ Thin Films on Sapphire with Tin-Doping Grown by Spray-Assisted Mist Chemical Vapor Deposition (Japanese Journal of Applied Physics 51 (2012) 070203)

SUMMARY OF INVENTION

Technical Problem

According to methods disclosed in Patent Document 1 and Non Patent Document 1, it is possible to form an α-gallium oxide (hereafter may be referred to as [$\alpha$-$Ga_2O_3$]) thin film with excellent electrical conductivity, but the film surface is not smooth, which is a particular problem, and the method is still unsatisfactory for use in the semiconductor device. In addition, a surface treatment such as etchings may be considered to smooth the film surface, and this causes problems such as the thin film being scraped off and semiconductor characteristics being degraded.

In order to meet the problem, Patent Document 2 discloses a method to reduce average roughness (Ra). However, even when this method is applied, a flatness of the surface is insufficient, and the characteristics of the semiconductor device using an obtained film are unsatisfactory.

The present invention has been made to solve the above-described problem. An object of the present invention is to provide a laminated structure having a crystalline oxide film with a smooth surface and a method for manufacturing the laminated structure.

Solution to Problem

To achieve the object, the present invention provides a laminated structure comprising:

- a ground substrate; and
- a crystalline oxide film containing gallium oxide as a main component, wherein
- a root-mean-square of a roughness on a surface of the crystalline oxide film is 0.2 μm or less;
- a diameter of the ground substrate is 50 mm or more; and
- ITV of the ground substrate is 30 μm or less.

Such laminated structure has a crystalline oxide film with a smooth surface, and when applied to a semiconductor device, the semiconductor characteristics are excellent.

In addition, in the present invention, the crystalline oxide film may be a single crystal or a uniaxial-orientated film.

Consequently, when applied to the semiconductor device, the semiconductor characteristics are excellent.

Moreover, in the present invention, it is preferable that a thickness of the ground substrate is 100 μm or more to 5000 μm or less.

This makes the surface smoother and thereby makes the laminated structures with better semiconductor characteristics when applied to the semiconductor device.

In addition, in the present invention, a film thickness of the crystalline oxide film may be 1 μm or more to 100 μm or less, Consequently, the semiconductor characteristics become more excellent when applied to the semiconductor device.

Furthermore, it is preferable that the ground substrate is a single crystal.

Hence the laminated structure can have a gallium oxide film with more excellent crystallinity.

In the present invention, it is also preferable that the ground substrate is any one of a sapphire substrate, a lithium tantalate substrate, or a lithium niobate substrate.

Accordingly, the laminated structure having a gallium oxide film with a smoother surface and more excellent crystallinity can be made.

Moreover, in the present invention, a surface roughness Ra of a surface opposite to a surface with the crystalline oxide film of the laminated structure may be 0.5 μm or less.

Such laminated structure has high quality and is suitable for manufacturing a semiconductor film unit. Furthermore, in the present invention, a waviness Wa of a surface opposite to a surface with the crystalline oxide film of the laminated structure may be 60 μm or less.

Such laminated structure has higher quality and is suitable for manufacturing the semiconductor film unit.

In addition, in the present invention, the semiconductor device having the laminated structure above described is provided.

Thus, the semiconductor device has more excellent characteristics.

Moreover, the present invention provides a method for manufacturing a laminated structure comprising the steps of:

- generating mist by mist-forming from a raw material solution containing gallium at a mist-forming unit;
- supplying a carrier gas for transporting the mist to the mist-forming unit;

transporting the mist by the carrier gas from the mist-forming unit to a film-forming chamber, in which a ground substrate is mounted, via a supply pipe connecting the mist-forming unit and the film-forming chamber; and forming a film on the ground substrate with the transported mist by heat treatment, wherein a diameter of the ground substrate is 50 mm or more and TVV is 30 μm or less.

According to such a method for manufacturing the laminated structure, the laminated structure having the crystalline oxide film with a smooth surface can be manufactured, Furthermore, in the present invention, a thickness of the ground substrate is 100 μm or more to 5000 μm or less.

Consequently, the surface becomes smoother, and the laminated structure with more excellent semiconductor characteristics can be manufactured when applied to the semiconductor device.

Moreover, in the present invention, a single crystal can be used as the ground substrate.

Consequently, the laminated structure having the gallium oxide film with more excellent crystallinity can be manufactured.

Furthermore, in the present invention, any one of a sapphire substrate, a lithium tantalate substrate, or a lithium niobate substrate can be used as the ground substrate.

Accordingly, the laminated structure having the gallium oxide film with a smoother surface and more excellent crystallinity can be manufactured at a lower cost.

Additionally, in the present invention, a surface roughness Ra of a surface opposite to a film-forming surface of the ground substrate may be 0.5 μm or less.

According to this method, the laminated structure having the semiconductor film with excellent crystal orientation and high quality can be manufactured stably. In addition, damage to a transfer system and a substrate carrier due to a back surface of the substrate is significantly alleviated. Consequently, dust generation in the apparatus is suppressed, and a degree of freedom in the materials for the transfer system and the substrate carrier is increased. Thus, the laminated structure having the semiconductor film with high quality can be manufactured at a lower cost.

Moreover, in the present invention, a waviness Wa of a surface opposite to a film-forming surface of the ground substrate is 50 μm or less.

By this means, heat conduction is improved due to an increase in the contact area with the substrate, a temperature of the substrate surface does not drop significantly during film-forming due to the raw material mist for film-forming, so the crystal orientation of the semiconductor film does not deteriorate, thus stable manufacturing of a high-quality laminated structure is enabled.

Moreover, in the present invention, the ground substrate is mounted on a stage, and a surface roughness Ra of a contact surface with the ground substrate on the stage may be 0.5 μm or less in the film-formation process.

According to this method, the laminated structure having the semiconductor film with excellent crystal orientation and high quality can be manufactured stably. In addition, damage to a transfer system and a substrate carrier due to a back surface of the substrate is significantly alleviated. Consequently, dust generation in the apparatus is suppressed and a degree of freedom in the materials for the transfer system and the substrate carrier is increased. Thus, the laminated structure having the semiconductor film with a corundum crystal structure of high quality can be manufactured at a lower cost.

Furthermore, in the present invention, the ground substrate is mounted on the stage, and a waviness Wa of a contact surface with the ground substrate on the stage may be 50 μm or less in the film-formation process.

By this means, heat conduction is improved due to an increase in a contact area with the substrate, a temperature of the substrate surface does not drop significantly during film-forming due to the raw material mist for film-forming, so the crystal orientation of the semiconductor film does not deteriorate, thus stable manufacturing of a high-quality laminated structure is enabled.

Advantageous Effects of Invention

As described above, according to a laminated structure of the present invention, the laminated structure has a crystalline oxide film with a smooth surface and excellent semiconductor characteristics, when applied to a semiconductor device. In addition, according to a method of the present invention for manufacturing a laminated structure, the laminated structure having a crystalline oxide film with a smooth surface and excellent semiconductor characteristics can be manufactured, when applied to a semiconductor device.

BRIEF DESCRIPTION OF DRAWINGS

FIG. 1 is a schematic constitutional view illustrating an example of a semiconductor device of the present invention.

FIG. 2 is a schematic constitutional view illustrating an example of a film-forming apparatus used for a method for manufacturing a laminated structure of the present invention.

FIG. 3 is a view illustrating a relation of the present invention between TTV of the ground substrate and a root-mean-square of a roughness on a surface of the crystalline oxide film.

FIG. 4 is a schematic constitutional view illustrating an example of a mist-forming unit of the present invention.

DESCRIPTION OF EMBODIMENTS

As described above, providing a laminated structure with a crystalline oxide film of a smooth surface and a method for manufacturing the laminated structure are desired.

To solve the above problem, the present inventors have earnestly studied and found out that a laminated structure comprising:

a ground substrate; and a crystalline oxide film containing gallium oxide as a main component, wherein a root-mean-square of a roughness on a surface of the crystalline oxide film is 0.2 μm or less;

a diameter of the ground substrate is 50 mm (2 inches) or more; and

TTV of the ground substrate is 30 μm or less.

Such laminated structure has a crystalline oxide film with a smooth surface and excellent semiconductor Characteristics when applied to a semiconductor device.

Thus, the present invention has been completed.

In addition, the present inventors found out that a method for manufacturing a laminated structure comprising the steps of:

generating mist by mist-forming from a raw material solution containing gallium at a mist-forming unit;

supplying a carrier gas for transporting the mist to the mist-forming unit;

transporting the mist by the carrier gas from the mist-forming unit to a film-forming chamber, in which a ground substrate is mounted, via a supply pipe connecting the mist-forming unit and the film-forming chamber; and forming a film on the ground substrate with the transported mist by heat treatment, wherein a diameter of the ground substrate is 50 mmm or more and TVV is 30 μm or less.

Furthermore, the laminated structure having a crystalline oxide film with a smooth surface and excellent semiconductor characteristics can be manufactured when applied to a semiconductor device.

Thus, the present invention has been completed.

In this case, the mist of the present invention is a general term for fine liquid particles dispersed in a gas and includes what are called such as fog, and droplets. The following explanation is given with reference to the drawings.

Hereinafter, the present invention will be described in detail, however, the present invention is not limited thereto.

(Laminated Structure)

FIG. 1 shows a semiconductor device 100 having a laminated structure 110 of the present invention. As shown in FIG. 1, the laminated structure 110 of the present invention has a ground substrate 101 and a crystalline oxide film 103 containing gallium oxide as a main component. A root-mean-square of a roughness on a surface 103*c* of the crystalline oxide film 103 is 0.2 μm or less and a diameter of the ground substrate 101 is 50 mm (2 inches) or more, and then TTV of the ground substrate 101 is 30 μm or less. Consequently, the laminated structure 110 has the crystalline oxide film 103 with a smooth surface and excellent semiconductor characteristics, when applied to a semiconductor device.

(Ground Substrate)

Conventionally, as the diameter of the substrate 101 increases, the root-mean-square of the roughness on the surface of the crystalline oxide film 103 worsens significantly, especially for a substrate with a diameter of 50 mm or more, a roughness of 0.2 μm or less is not obtainable. Hence the present inventors have earnestly studied and found out that RMS on the surface of the crystalline oxide film increases sharply when TTV of the ground substrate exceeds 30 μm as shown in FIG. 3. As described later, deterioration of thermal contact with a heater and increase of thermal resistance are considered as a reason. In consequence, TTV of the present invention is set to 30 μm or less. As in the present invention, when the diameter of the ground substrate 101 is 50 mm (2 inches) or more, the root-mean-square of the roughness on the surface 103*c* of the crystalline oxide film 103 is 0.2 μm or less by setting TTV of the substrate 101 to 30 μm or less.

The ground substrate for the laminated structure of the present invention has a diameter of 50 mm (2 inches) or more and TTV of 30 μm or less. The upper limit of the diameter is not particularly limited and can be 300 mm or less, for example. Furthermore, the lower limit of TTV is not particularly limited and can be 0.1 μm or more, for example.

TTV is an abbreviation for total thickness variation and a difference between the maximum and minimum values of a height over an entire wafer surface measured in the thickness direction with a back surface of the wafer as a reference surface. In the present invention, TTV of the ground substrate is 30 μm or less. In this case, an obtainable TTV of the laminated structure is also 30 μm or less. TTV can be measured by such as a micrometer, an electrostatic capacitance method, optical interferometry, or a laser confocal method.

A Ra of a surface opposite to a surface 103*c* with the crystalline oxide Film of the laminated structure may be 0.5 μm or less. The smaller the surface roughness Ra, the preferable. The lower Limit is not particularly limited and can be 0.1 nm or more, for example. When the surface roughness Ra is 0.5 μm or less, heat conduction does not deteriorate because the contact area with the ground substrate 101 is not reduced. Consequently, a crystal orientation of a semiconductor film does not deteriorate because a temperature on the surface of the substrate during a film forming does not decline by a raw material mist for a film formation.

A waviness Wa on the surface opposite to the surface 103*c* with the crystalline oxide film of the laminated structure may be 50 μm or less. The smaller the waviness Wa, the preferable. The lower limit is not particularly limited and can be 0.5 μm or more, for example. When the Wa is 50 μm or less, heat conduction improves because the contact area with the ground substrate 101 is widened. Consequently, a crystal orientation of a semiconductor film does not deteriorate because a temperature on the surface of the substrate during a film formation does not decline significantly by a raw material mist for the film formation.

The waviness Wa is defined as "a magnitude of deviation from a geometrically correct plane of a plane shape." The waviness Wa may be measured on one or more freely-selected strait lines on an appropriately determined mounted surface according to the shape of the mounted surface. For example, when the mounted surface has a circular shape, the diameter of the circle can be defined as a measured length on two straight lines that intersect at right angles at the center of the substrate. The waviness Wa is a value calculated based on JIS B 0601 using results of surface shape measurements methods by the tracer method, atomic force microscope (AFM) method, or non-contact measurement methods using a laser microscope or a confocal microscope such as optical interferometry, a confocal method, and image synthesis method by focal shift.

The thickness of the ground substrate is preferably between 100 μm or more to 5000 μm or less. When the thickness is within the range, handling is satisfactory and the film with excellent quality is obtainable due to lowered heat resistance during the film formation.

The ground substrate is not limited as long as it can support the crystalline oxide film. The material is also not limited and may be any known substrate, and may be an organic compound or an inorganic compound. For example, polysulfone, polyethersulfone, polyphenylene sulphide, polyether ether ketone, polyimide, polyetherimide, fluororesin, metals such as iron, aluminum, stainless steel, and gold, quartz, glass, calcium carbonate, gallium oxide, ZnO are exemplified.

In addition, single crystal substrates of silicon, sapphire, and α-type gallium, lithium tantalate, lithium niobate, SiC, GaN, iron oxide, and chromium oxide are included. The ground substrate for the laminated structure of the present invention is preferably the single crystal substrate above-described. By using these materials, the crystalline oxide film with higher quality is obtainable. In particular, a sapphire substrate, a lithium tantalate substrate, and a lithium niobate substrate are relatively inexpensive and industrially advantageous.

Furthermore, the RMS on the surface of the ground substrate is preferably 0.1 μm or less. The use of such substrate facilitates obtaining the crystalline oxide film with the RMS of 0.2 μm or less. Moreover, a particle density of 0.5 μm or more on the ground substrate is preferably $50/cm^2$ or less. It is preferable that a metal impurity density is $1\times10^{11}/cm^2$ or less. By using such a ground substrate, the obtainment of the crystalline oxide film with excellent crystallinity becomes easier. Once the laminated structure is manufactured, it is difficult to evaluate such as the RMS on the surface of the ground substrate, the particle density, and the metal impurity density on the ground substrate.

(Crystalline Oxide Film)

A crystalline oxide film of a laminated structure of the present invention is the crystalline oxide film containing gallium oxide as a main component and a root-mean-square of a roughness on a surface of a surface of the crystalline oxide film containing gallium oxide as a main component is 0.2 μm or less. The lower limit of the root-mean-square of roughness is not particularly limited and can be 0.0001 μm or more, for example.

Generally, the crystalline oxide film is composed of metal and oxygen, however, the crystalline oxide film of the laminated structure of the present invention should be mainly composed of gallium as a metal. In addition, "gallium as the main component" means 50 to 100% of the metal component is gallium in this present invention. The metal component other than gallium may include, for example, one or more metals selected from iron, indium, aluminum, vanadium, titanium, chromium, rhodium, iridium, nickel, and cobalt.

The crystalline oxide film may contain dopant elements. For example, n-type dopants such as tin, germanium, silicon, titanium, zirconium, vanadium, or niobium, or p-type dopants such as copper, silver, nickel, tin, iridium, rhodium, cobalt, and magnesium are contained but not particularly limited. A concentration of the dopant may be such as about $1\times10^{36}/cm^3$ or more to $1\times10^{22}/cm^3$ to less, or low concentration of about $1\times10^{17}/cm^3$ or less, or even a high concentration of about $1\times10^{20}/cm^3$ or higher.

The crystal structure of the crystalline oxide film is not particularly limited, and it may be a β-Gallia Structure, a corundum structure, or a rectangular crystal. The film is preferably a single crystal of uniaxially oriented, although a mixture of a plurality of a crystal structure or a polycrystal is acceptable. The film being the single crystal or uniaxially oriented can be confirmed by an X-ray diffractometer or an electron diffractograph. When the film is irradiated with X-rays or electron beams, diffraction images are obtained according to the crystal structure, and only certain peaks appear when the film is uniaxially oriented. Consequently, the uniaxial orientation is Judged.

When the root-mean-square (RMS) of roughness can be 0.2 μm or less, RMS is not particularly limited thereto. Moreover, the root-mean-square (RMS) of roughness is a value calculated according to JIS B 0601 (corresponding to Rq in the same standard) using surface shape measurement results of a 10-μm square area by an atomic force microscope (AFM).

Furthermore, an arithmetic mean roughness (Ra) is a value calculated according to JIS B 0601 using surface shape measurement results of a 10-μm square area by an atomic force microscope (AFM).

The film thickness of the crystalline oxide film is not particularly limited, preferably 1 μm or more. The upper limit is not particularly limited. For example, the thickness may be 100 μm or less, preferably 50 μm or less, and further preferably can be 20 μm or less. This film thickness provides superior semiconductor characteristics, such as improved breakdown voltage, when applied to the semiconductor device.

Another layer may be interposed between the ground substrate and the crystalline oxide film. Another layer is the layer having a different composition from the ground substrate and the crystalline oxide film on the top surface and is also called a buffer layer. The buffer layer may be an oxide semiconductor film, an insulating film, or a metal film regardless of which one is chosen. Materials, such as $Al_2O_3$, $Ga_2O_3$, $Cr_2O_3$, $Fe_2O_3$, $In_2O_3$, $Rh_2O_3$, $V_2O_3$, $Ti_2O_3$, and $Ir_2O_3$ are suitably used. The thickness of the buffer layer is preferably 0.1 μm or more to 2 μm or less.

(Film-Forming Apparatus)

FIG. 2 shows an example of a film-forming apparatus 201 of a method for manufacturing a laminated structure of the present invention. The film-forming apparatus 201 at least includes: a mist-forming unit 220 generating a mist from a raw material solution **204*a* containing gallium by atomizing into the mist; a carrier gas supply unit 230 supplies carrier gas to transport the mist; a supply pipe 209 connecting the mist-forming unit 220 and a film-forming chamber 207 thereby the mist is transported by the carrier gas; and the film-forming chamber 207 performs the heat treatment to mist supplied with the carrier gas from the supply pipe 209 and then forms the film on a ground substrate 210**.

(Mist-Forming Unit)

In the mist-forming unit 220, the raw material solution **204*a* containing gallium is atomized into the mist and generates mist. The method for atomizing into the mist is not particularly limited when the raw material solution 204*a*** containing gallium can be atomized into the mist, maybe the publicly known method for atomizing into the mist, but the method for atomizing into the mist by ultrasonic vibrations is preferable. Because this enables more stable atomizing into the mist.

An example of such mist-forming unit 220 is shown in FIG. 4. The mist-forming unit 220 may include: a mist generator 204 in which the raw material solution **204*a* containing gallium is stored; a container 205 into which a medium capable of transmitting ultrasonic vibrations, such as water 205*a*, is placed; and an ultrasonic vibrator 206 is attached to the bottom of a container 205. In detail, the mist generator 204 has a container, in which the raw material solution 204*a* containing gallium is housed, which can be stored with a support member (not shown) in the container 205 containing water 205*a*. At the bottom of container 205, the ultrasonic vibrator 206 may be provided, and the ultrasonic vibrator 206 may be connected to an oscillator 216. Additionally, when the oscillator 216 is operated, the ultrasonic vibrator 206 oscillates, then the ultrasonic waves propagate into the mist generator 204 via the water 205*a*. Consequently, the apparatus can be configured to atomize the raw material solution 204*a*** containing gallium into the mist.

(Raw Material Solution Containing Gallium)

When the raw material solution **204*a* containing gallium can be atomized into a mist, the material contained in the solution is not particularly limited as long as the material contains gallium, and can be either inorganic materials or organic materials. Metal and metal compounds are suitably used, and such as one or more metals selected from gallium, iron, indium, aluminum, vanadium, titanium, chromium, rhodium, nickel, and cobalt may be used. As such raw material solutions, the metal dissolved or dispersed in the organic solvent or water in the form of a complex or a salt can be suitably used. As forms of salts, halide salts such as metal chloride salt, metal bromide salt, and metal iodide salt also can be used. In addition, the above metals dissolved in hydrogen halides such as hydrobromic acid, hydrochloric acid, and hydroiodic acid can also be used as salt solutions. As forms of complexes, such as acetylacetonate complexes, carbonyl complexes, ammine complexes, and hydride complexes can be exemplified. By mixing the salt solvent above described with acetylacetone, an acetylacetonate complex can be formed. A metal concentration in the raw material solution 204***a* containing gallium is not particularly limited and can be such as 0.005 mol/L or more to 1 mol/L or less.

The raw material solution 204*a* containing gallium can be mixed with additives such as hydrohalic acid or oxidizing agent. Hydrohalic acids include, for example, hydrobromic acid, hydrochloric acid, and hydroiodic acid, of which hydrobromic acid or hydroiodic acid is preferable. Oxidizing agents include peroxides such as hydrogen peroxide ($H_2O_2$), sodium peroxide ($Na_2O_2$), barium peroxide ($BaO_2$), benzoyl peroxide ($(C_6H_5CO)_2O_2$), and organic peroxides such as hypochlorous acid (HClO), perchloric acid, nitric acid, ozone water, peracetic acid, and nitrobenzene.

The raw material solution 204*a* containing gallium may contain the dopant. The dopant is not particularly limited and includes n-type dopants such as tin, germanium, silicon, titanium, zirconium, vanadium or niobium, or p-type dopants such as copper, silver, iridium, rhodium, and magnesium, for example.

(Carrier Gas Supply Unit)

As shown in FIG. 2, the carrier gas supply unit 230 have a carrier gas source 202*a* to supply carrier gas. In this case, a flow regulating valve 203*a* may be installed to regulate the flow rate of the carrier gas supplied from the carrier gas source 202*a*. Additionally, when it is needed, the unit can also be equipped with a diluent carrier gas source 202*b* to supply dilution carrier gas as needed and a flow regulating valve 203*b* to regulate the flow rate of the dilution carrier gas supplied from the diluent carrier gas source 202*b*.

The type of the carrier gas is not particularly limited and can be selected according to the film to be filmed. For example, oxygen, ozone, inert gas such as nitrogen or argon, or reducing gas such as hydrogen gas ox forming gas can be used. Additionally, the types of the carrier gas may be one or more. For example, the same gas with a first carrier gas can be used with another diluted gas (e.g., diluted 10 times) as a second carrier gas or even an air can be used. The flow rate of the carrier gas is not particularly limited and in the case of forming a film of 50 mm (2 inches) on a ground substrate, it is preferable to set the flow rate of the carrier gas to 0.05 L/min to 50 L/min and more preferably to set 5 L/min or more to 20 L/min to less.

(Supply Pipe)

The film-forming apparatus 201 is composed of a supply pipe 209 connecting a mist-forming unit 220 and a film-forming chamber 207. In this case, the mist is transported by a carrier gas from a mist-forming unit 220 of a mist generator 204 and then supplied to a film-forming chamber 207 via a supply pipe 209. For example, a quartz tube, a glass tube, or a resin tube can be used as the supply pipe 209.

(Film-Forming Chamber)

In the film-forming chamber 207, a ground substrate 210 is mounted and a heater 208 to heat the ground substrate 210 can be installed. The heater 208 may be installed on the outer side of the film-forming chamber 207 as shown in FIG. 2 or may be installed inside the film-forming chamber 207. Additionally, the film-forming chamber 207 may be provided with an exhaust port 212 for exhaust gas at a position that does not affect the supply of mist to the ground substrate 210. The ground substrate 210 may be mounted on the top of the film-forming chamber 207, for example, face-down, or the ground substrate 210 may be mounted on the bottom of the film-forming chamber 207, for example, face-up.

Moreover, a stage to mount the ground substrate 210 may be installed in the film-forming chamber 207. In this case, a surface roughness Ra of the stage may be less than 0.5 μm or less. The smaller the surface roughness Ra, the preferable, the lower limit is not particularly limited, for example, but can be 0.1 nm or more. When the surface roughness Ra is 0.5 μm or less, heat conduction does not degrade because the contact area with the ground substrate 210 is not decreased. Consequently, a crystal orientation of a semiconductor film does not deteriorate because a temperature on the surface of the substrate during a film formation does not drop by a raw material mist for the film formation.

In addition, the waviness Wa may be 50 μm or less. The smaller the waviness Wa, the preferable, the lower limit is not particularly limited, for example, but can be 0.5 μm or more. When the Wa is 50 μm or less, heat conduction is improved because the contact area with the ground substrate 210 is widened. Consequently, a crystal orientation of a semiconductor film does not deteriorate because the temperature on the surface of the substrate during film-forming does not decline by a raw material mist for the film formation.

(Method for Manufacturing Laminated Structure)

Then, an example of a method for manufacturing a laminated structure of the present invention will be described with reference to FIG. 2 below. The present invention is characterized by setting a diameter of a substrate to 50 mm or more and PTV to 30 μm or less in mist CVD.

Unlike other CVD methods, a mist CVD method needs to make raw materials attain on a substrate surface in a liquid form. Consequently, a temperature of the substrate drops significantly. Under these circumstances, when TTV of the substrate is 30 μma ox more, thermal contact between the substrate and a heater is degraded. Simultaneously, thermal resistance becomes relatively higher where a thickness of the substrate is thicker than others. Accordingly, this influences the temperature of the substrate surfaces to further decline. In particular, this effect is significant when a diameter is 50 mm or more. When a film formation is performed under this condition, abnormal growth occurs on a film surface, and a surface roughness of a film obtained is enormously large over 0.2 μm. Consequently, in the method for manufacturing the laminated structure of the present invention, the laminated structure having a root-mean-square of roughness on a film surface is 0.2 μm or less in as-grown condition by using a ground substrate with a diameter of 50 mm or more and TTV of 30 μm or less.

A raw material solution 204*a* containing gallium, which is mixed with the method above described, is stored in a mist generator 204 and then the ground substrate 210 is mounted on a film-forming chamber 207, and activate a heater 208. Then, by opening the flow regulating valves 203*a* and 203*b*, carrier gas from the carrier gas sources 202*a* and 202*b* is supplied into the film-forming chamber 207. After the atmosphere in the film-forming chamber 207 is sufficiently replaced by the carrier gas, the flow rate of the carrier gas and the flow rate of the carrier gas for dilution are regulated respectively.

Moreover, as the mist generation step, an ultrasonic vibrator 206 is vibrated, and the vibration is propagated to the raw material solution 204*a* containing gallium via a water 205*a*, and then the raw material solution 204*a* containing gallium is atomized into the mist, consequently, the mist is generated.

Furthermore, as a carrier gas supplying step, the carrier gas is supplied to the mist-forming unit 220 to transport the mist.

Moreover, as a transport step, the mist is transported by the carrier gas from mist-forming unit 220 to the film-forming chamber 207 via the supply pipe 209 that connects the mist-forming unit 220 and the film-forming chamber 207.

Then, as a film-formation step, the mist transported to the film-forming chamber 207 is heated and produces a thermal reaction to form a film on a part of or the entire surface of the ground substrate 210.

The thermal reaction of the mist by heating is sufficient when the mist reacts by heating, and a reaction condition is not particularly limited. The condition can be set appropriately according to raw materials and film-forming materials. For example, a heating temperature is a range from 120° C. to 600° ° C., more preferably can be a range from 200° C. to 600° C., further preferably can be a range from 300° ° C. to 550° C.

The thermal reaction may be performed under any of a vacuum, non-oxygen atmosphere, reducing gas atmosphere, air atmosphere, or oxygen atmosphere, and may be set according to the film-forming material, appropriately. Moreover, reaction pressuring can be performed at any atmospheric pressure, pressurized or depressurized, though the film formation at atmospheric pressure is preferable because an apparatus configuration can be simplified.

(Buffer Layer)

In the film formation described above, a buffer layer can be formed between a film and a ground substrate, appropriately. A method for forming the buffer layer is not particularly limited, the film forming can be performed by a publicly known method such as sputtering, and evaporation, but in the case of a mist CVD method as described above, it is easy to form by simply changing a raw material solution containing gallium as needed. Specifically, selected from metals composed of any or more of aluminum, gallium, chromium, iron, indium, rhodium, vanadium, titanium, and iridium, dissolved or dispersed in water in the form of complexes or salts, can be suitably used as a raw material aqueous solution. The complex forms include acetylacetonate complex, carbonyl complex, ammine complex, and hydride complex, for example. The salt forms include metal chloride salts, metal bromide salts, and metal iodide salts, for example. The above metals dissolved in such as hydrobromic acid, hydrochloric acid, and hydroiodic acid can also be used as salt aqueous solutions. In this case, a solute consistency is preferably 0.005 mol/L or more to 1 mol/L or less, and a melting temperature is set to 20° C. or more. The formation of the buffer layer can be formed by setting other conditions in the same way as above. After the buffer layer is film-formed in a predetermined thickness, the crystalline oxide film is formed.

(Heat Treatment)

In addition, a film obtained by a film formation method by a method for manufacturing a laminated structure of the present invention may be performed by heat treatment from 200° C. or more to 600° C. or less. Consequently, an unreacted material in the film is removed, and a higher-quality laminated structure can be obtained. The heat treatment can be performed in air, an oxygen atmosphere, or an inert gas atmosphere such as nitrogen or argon. The heat treatment time is determined as appropriate and maybe 5 to 240 minutes, for example.

(Delamination)

In a laminated structure of the present invention, a crystalline oxide film may be delaminated from a ground substrate. The method for delamination is not particularly limited and may be a publicly known method. The methods for delamination include such as a method for delamination by mechanical shock, a method for delamination by applying heat such as thermal stress, a method for delamination by applying vibration such as ultrasonic waves, or a method for delamination by an etching. By delamination above described, the crystalline oxide film can be obtained as a self-supporting film.

(Example for a Structure of Semiconductor Device)

A suitable example of a semiconductor device 100 using a laminated structure of the present invention is shown in FIG. 1. In the example shown in FIG. 1, a crystalline oxide film 103 is formed on a ground substrate 101. The crystalline oxide film 103 is composed of an insulating thin film 103*a* and a conductive thin film 103*b* laminated in sequential order from the ground substrate 101. A gate insulator film 105 is formed on a conductive thin film 103*b*. A gate electrode 107 is formed on the gate insulator film 105. Additionally, a source and drain electrode 109 is formed on the conductive thin film 103*b*, sandwiching the gate electrode 107. Based upon this configuration, a depletion layer formed in the conductive thin film 103*b* can be controlled by a gate voltage applied to the gate electrode 107, enabling transistor operation (FET device).

The semiconductor devices formed by the laminated structure include transistors such as MIS, HEMT, IGBT, and TFT or Schottky barrier diodes using semiconductor-metal junction, PN or PIN diodes combined with other P-layers, light receiving and emitting elements. The laminated structure of the present invention is useful fox the improvement of the characteristics of these devices.

(Manufacturing System of Laminated Structure)

Then, an example of a system for manufacturing of a laminated structure of the present invention will be described with reference to FIG. 2 below. The present invention is characterized by setting a diameter of a substrate to 50 mm or more and TTV to 30 μm or less in mist CVD.

Unlike other CVD methods, the mist CVD method needs to make raw materials attain on a substrate surface in a liquid form. Consequently, a temperature of the substrate drops significantly. Under these circumstances, when TTV of the substrate is more than 30 un, thermal contact between the substrate and a heater is degraded. Simultaneously, a thermal resistance becomes relatively higher where a thickness of the substrate is thicker than others. Accordingly, this influences the temperature of the substrate surfaces to further decline. In particular, this effect is significant when a diameter is 50 mm or more. When a film formation is performed under this condition, abnormal growth occurs, and a surface roughness of a film obtained is enormously large over 0.2 μm. Consequently, in the system for manufacturing the laminated structure of the present invention, the laminated structure having a root-mean-square of roughness on a film surface of 0.2 μm or less can be manufactured in as-grown condition by using a ground substrate with a diameter of 50 mm or more and TPV of 30 μm or less.

A raw material solution 204*a* containing gallium, which is mixed with the method above described, is stored in a mist generator 204 and then the ground substrate 210 is mounted on a film-forming chamber 207, and activate a heater 208. Then, the flow regulating valves 203*a* and 203*b* were opened to supply carrier gas from the carrier gas sources 202*a* and 202*b* into the film-forming chamber 207. After the atmosphere in the film-forming chamber 207 is sufficiently replaced by the carrier gas, the flow rate of the carrier gas and the flow rate of the carrier gas for dilution are regulated respectively.

Moreover, as the mist generation mechanism, an ultrasonic vibrator 206 is vibrated, and the vibration is propagated to the raw material solution 204*a* containing gallium via a water 205*a*, and then the raw material solution 204*a* containing gallium is atomized into the mist, consequently, the mist is generated.

Furthermore, as a carrier gas supplying mechanism, the carrier gas is supplied to the mist-forming unit 220 to transport the mist.

Moreover, as a transport mechanism, the mist is transported by the carrier gas from mist-forming unit 220 to the film-forming chamber 207 via the supply pipe 209 that connects the mist-forming unit 220 and the film-forming chamber 207.

Then, as a film-formation mechanism, the mist transported to the film-forming chamber 207 is heated and produces a thermal reaction to form a film on a part of or the entire surface of the ground substrate 210.

The thermal reaction of the mist by heating is sufficient when the mist is reacted by heating, and a reaction condition is not particularly limited. The condition can be set appropriately according to raw materials and film-forming materials. For example, a heating temperature is a range from 120° C. to 600° C., more preferably can be a range from 200° ° C. to 600° C., further preferably can be a range from 300° C. to 550° C.

The thermal reaction may be performed under any of a vacuum, non-oxygen atmosphere, reducing gas atmosphere, air atmosphere, or oxygen atmosphere, and may be set according to the film-forming material, appropriately. Moreover, reaction pressuring can be performed at any atmospheric pressure, pressurized or depressurized, the film formation at atmospheric pressure is preferable because an apparatus configuration can be simplified, (Buffer Layer)

In the film formation described above, a buffer layer can be formed between a film and a ground substrate, appropriately. A method for forming the buffer layer is not particularly limited, the film forming can be performed by a publicly known method such as sputtering, and evaporation, but in the case of a mist CVD method as described above, it is easy to form by simply changing a raw material solution containing gallium as needed. Specifically, selected from metals composed of any or more of aluminum, gallium, chromium, iron, indium, rhodium, vanadium, titanium, and iridium, dissolved or dispersed in water in the form of complexes or salts, can be suitably used as a raw material aqueous solution. The complex forms include acetylacetonate complex, carbonyl complex, ammine complex, and hydride complex, for example. The salt forms include metal chloride salts, metal bromide salts, and metal iodide salts, for example. The above metals dissolved in such as hydrobromic acid, hydrochloric acid, and hydroiodic acid can also be used as salt aqueous solutions. In this case, a solute consistency is preferably 0.005 mol/L or more to 1 mol/L or less, and a melting temperature is set to 20° C. or more. The formation of the buffer layer can be formed by setting other conditions in the same way as above. After the buffer layer is film-formed in a predetermined thickness, the crystalline oxide film is formed.

(Heat Treatment)

In addition, a film obtained by a film formation system by a system for manufacturing a laminated structure of the present invention may be performed by heat treatment from 200° C. or more to 600° C. or less. Consequently, an unreacted material in the film is removed, and a higher-quality laminated structure can be obtained. The heat treatment can be performed in air, an oxygen atmosphere, or an inert gas atmosphere such as nitrogen or argon. The heat treatment time is determined as appropriate and maybe 5 to 240 minutes, for example.

(Delamination)

In a laminated structure of the present invention, a crystalline oxide film may be delaminated from a ground substrate. The method for delamination is not particularly limited and may be a publicly known method. The methods for delamination include such as a method fox delamination by mechanical shock, a method for delamination by applying heat such as thermal stress, a method for delamination by applying vibration such as ultrasonic waves, or a method for delamination by an etching. By delamination above described, the crystalline oxide film can be obtained as a self-supporting film.

In addition, the system for manufacturing the laminated structure is preferable which confirms TTV is 30 μm or less when the diameter of the ground substrate is 50 mm or more before mounting the ground substrate in the film-forming chamber.

EXAMPLE

Hereinafter, the present invention will be specifically described with reference to Examples and Comparative Examples. However, the present invention is not limited thereto.

Example 1

While referring to FIG. 2, a film-forming apparatus 201 in this example is explained. A film-forming apparatus 201 included the following components:

- a carrier gas source 202*a* supplying a carrier gas;
- a flow regulating valve 203*a* for regulating a flow of the carrier gas supplied from the carrier gas source 202*a;*
- a diluent carrier gas source 202*b* supplying a diluent carrier gas;
- a flow regulating valve 203*b* for regulating a flow of a diluent carrier gas supplied from the diluent carrier gas source 202*b;*
- a mist generator 204 for containing a raw material solution 204*a* which contains gallium;
- a container 205 containing a water 205*a;*
- an ultrasonic vibrator 206 attached to the bottom surface of the container 205;
- a film-forming chamber 207 being installed a heater 208; and
- a supply pipe 209 made of quarts, which connects the mist generator 204 and the film-forming chamber 207.

(Ground Substrate)

A c-plane sapphire substrate with a diameter of 100 mm (4 inches) was prepared as a ground substrate 210. A measurement result of TTV by a flatness tester of optical interference was 16 μm. The substrate was mounted in a film-forming chamber 207 and heated to 500° C. by operating a heater 208.

(Raw Material Solution Containing Gallium)

Then, a raw material solution containing gallium was prepared. A solvent was ultrapure water and a solute was gallium bromide. A concentration of gallium was 0.1 mol/L and this solution was used as a raw material solution 204*a* containing gallium.

(Film-Formation)

The raw material solution 204*a* containing gallium obtained as described above was stored in mist generator 204. Then flow regulating valves 203*a* and 203*b* opened and supplied a carrier gas from carrier gas sources 202*a* and 202*b* into a film-forming chamber 207. After an atmosphere in the film-forming chamber 207 was sufficiently replaced with the carrier gas, the flow rate of the carrier gas was adjusted to 2 L/min and the flow rate of a diluent carrier gas was adjusted to 6 L/min, respectively. Nitrogen was used as the carrier gas.

Moreover, an ultrasonic vibrator 206 was vibrated at 2.4 MHz, the vibration was propagated to the raw material solution 204*a* containing gallium via a water 205*a*, and then a mist was generated by atomizing the raw material solution 204*a* containing gallium into the mist. The mist was introduced into the film-forming chamber 207 by the carrier gas via a supply pipe 209. Furthermore, a thin film of gallium oxide was formed on a ground substrate 210 by a thermal reaction of the mist in the film-forming chamber 207 at 500° C. under atmospheric pressure. The time for film formation was 30 minutes.

(Evaluation)

A thin film formed on the ground substrate 210 was confirmed by X-ray diffraction that $\alpha$-$Ga_2O_3$ was formed. Then, a root-mean-square of roughness (RMS) of the film surface was measured by AFM. As a result, RMS was 8 nm. Moreover, when a film thickness was measured by a reflecting spectrographic film thickness meter F50 from FILMETRICS Co., the thickness was 0.52 μm.

Examples 2 and 3

C-plane sapphire substrates with different TTVs having a diameter of 100 mm (4 inches) were prepared as a ground substrate 210. Specifically, the substrates with ITVs of 3 μm and 26 μm were prepared and a film-forming and evaluation were conducted under the same condition as Example 1 except for TTVs. As a result, RMSs were 2 μm and 8 μm, respectively. In addition, film thicknesses were 0.49 μm and 0.51 μm, respectively.

Comparative Examples 1 and 2

C-plane sapphire substrates with TTVs of 41 μm and 61 μm and a diameter of 100 mm (4 inches) were prepared as a ground substrate 210. A film-forming and evaluation were conducted under the same condition as Example 1 except for TTVs. As a result, RMSs were 245 nm and 303 nm, respectively. In addition, film thicknesses were 0.47 μm and 0.46 μm, respectively.

Example 4

A film-forming and evaluation were conducted under the same condition as Example 1 except for a film formation time was 60 minutes. As a result, a film thickness was 1.1 μm and RMS was 11 nm.

Example 5

A film-forming and evaluation were conducted under the same condition as Example 1 except for a film-formation time was 480 minutes. As a result, a film thickness was 8.5 μm and RMS was 15 nm.

Example 6

A film-forming and evaluation were conducted under the same condition as Example 1 except for Ra of a non-film-formation surface of a substrate was 0.41 μm. As a result, RMS was 7 nm and a film thickness was 0.51 μm.

Example 7

A film-forming and evaluation were conducted under the same condition as Example 1 except for Wa of a non-film-formation surface of a substrate was 47.7 μm. As a result, RMS was 10 nm and a film thickness was 0.53 μm.

Example 8

A film-forming and evaluation were conducted under the same condition as Example 1 except for mounting a copper plate (stage) on a heater and Ra of the copper plate was 0.45 μm. As a result, RMS was 5 nm and a film thickness was 0.48 μm.

Example 9

A film-forming and evaluation were conducted under the same condition as Example 1 except for mounting a copper plate (stage) on a heater and Wa of the copper plate was 48.2 μm. As a result, RMS was 6 nm and a film thickness was 0.50 μm.

A graph summarizing Examples 1, 2, and 3 and Comparison Examples 1 and 2 is shown in FIG. 3. This indicates that RMS of a surface of a crystalline oxide film significantly increases when TTV of the ground substrate exceeds 30 μm. As described above, it is considered that this is caused by the degradation of thermal contact with the heater and the increase of heat resistance.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A laminated structure comprising:
- a ground substrate; and
- a crystalline oxide film containing gallium oxide as a main component, wherein
- a root-mean-square of a roughness on a surface of the crystalline oxide film is 0.2 μm or less;
- a diameter of the ground substrate is 50 mm or more; and TTV of the ground substrate is 30 μm or less.

2. The laminated structure according to claim 1, wherein the crystalline oxide film is a single crystal or a uniaxial-orientated film.

3. The laminated structure according to claim 1, wherein a thickness of the ground substrate is 100 μm or more to 5000 μm or less.

4. The laminated structure according to claim 1, wherein a film thickness of the crystalline oxide film is 1 μm or more to 100 μm or less.

5. The laminated structure according to claim 1, wherein the ground substrate is a single crystal.

6. The laminated structure according to claim 1, wherein the ground substrate is any of a sapphire substrate, a lithium tantalate substrate, or a lithium niobate substrate.

7. The laminated structure according to claim 1, wherein a surface roughness Ra of a surface opposite to a surface with the crystalline oxide film of the laminated structure is 0.5 μm or less.

8. The laminated structure according to claim 1, wherein a waviness Wa of a surface opposite to a surface with the crystalline oxide film of the laminated structure is 50 μm or less.

9. A semiconductor device comprises the laminated structure according to claim 1.

10. A method for manufacturing a laminated structure comprising the steps of:

generating mist by mist-forming from a raw material solution containing gallium at a mist-forming unit;

supplying a carrier gas for transporting the mist to the mist-forming unit;

transporting the mist by the carrier gas from the mist-forming unit to a film-forming chamber, in which a ground substrate is mounted, via a supply pipe connecting the mist-forming unit and the film-forming chamber; and forming a film on the ground substrate with the transported mist by heat treatment, wherein a diameter of the ground substrate is 50 mm or more and TVV is 30 μm or less.

11. The method for manufacturing a laminated structure according to claim 10, wherein a thickness of the ground substrate is 100 μm or more to 5000 μm or less.

12. The method for manufacturing a laminated structure according to claim 10, wherein the ground substrate is a single crystal.

13. The method for manufacturing a laminated structure according to claim 10, wherein the ground substrate is any of a sapphire substrate, a lithium tantalate substrate, or a lithium niobate substrate.

14. The method for manufacturing a laminated structure according to claim 10, wherein a surface roughness Ra of a surface opposite to a film-forming surface of the ground substrate is 0.5 μm or less.

15. The method for manufacturing a laminated structure according to claim 10, wherein a waviness Wa of a surface opposite to a film-forming surface of the ground substrate is 50 μm or less.

16. The method for manufacturing a laminated structure according to claim 10, wherein the ground substrate is mounted on a stage, and a surface roughness Ra of a contact surface with the ground substrate on the stage is 0.5 μm or less in the film-formation process.

17. The method for manufacturing a laminated structure according to claim 10, wherein the ground substrate is mounted on the stage, and a waviness Wa of a contact surface with the ground substrate on the stage is 50 μm or less in the film-formation process.

* * * * *